US009873941B2

(12) United States Patent
Ito et al.

(10) Patent No.: US 9,873,941 B2
(45) Date of Patent: Jan. 23, 2018

(54) FILM-FORMING MANUFACTURING APPARATUS AND METHOD

(71) Applicants: NuFlare Technology, Inc., Numazu-Shi, Shizuoka (JP); Toyota Jidosha Kabushiki Kaisha, Toyota-shi, Aichi-Ken (JP)

(72) Inventors: Hideki Ito, Yokosuka (JP); Toshiro Tsumori, Zama (JP); Kunihiko Suzuki, Shizuoka (JP); Hidekazu Tsuchida, Yokosuka (JP); Isaho Kamata, Tokyo (JP); Masahiko Ito, Yokosuka (JP); Masami Naito, Inazawa (JP); Hiroaki Fujibayashi, Zushi (JP); Ayumu Adachi, Toyota (JP); Koichi Nishikawa, Nagoya (JP)

(73) Assignees: NuFlare Technology, Inc., Shizuoka (JP); Toyota Jidosha Kabushiki Kaisha, Aichi-ken (JP)

( * ) Notice: Subject to any disclaimer, the term of this patent is extended or adjusted under 35 U.S.C. 154(b) by 399 days.

(21) Appl. No.: 14/812,130

(22) Filed: Jul. 29, 2015

(65) Prior Publication Data
US 2015/0329967 A1 Nov. 19, 2015

Related U.S. Application Data

(62) Division of application No. 13/196,309, filed on Aug. 2, 2011, now abandoned.

(30) Foreign Application Priority Data

Aug. 27, 2010 (JP) .................................. 2010-190259
Mar. 15, 2011 (JP) .................................. 2011-056995

(51) Int. Cl.
C23C 16/32 (2006.01)
C23C 16/455 (2006.01)
(Continued)

(52) U.S. Cl.
CPC .......... *C23C 16/325* (2013.01); *C23C 16/455* (2013.01); *C23C 16/458* (2013.01);
(Continued)

(58) Field of Classification Search
CPC ... C23C 16/325; C23C 16/455; C23C 16/458; C23C 16/46; C23C 16/45557; C23C 16/45519; C30B 25/10
(Continued)

(56) References Cited

U.S. PATENT DOCUMENTS 4,793,283 A * 12/1988 Sarkozy .............. C23C 16/4412
  118/715
4,950,870 A * 8/1990 Mitsuhashi ............. C30B 25/10
  219/390
(Continued)

FOREIGN PATENT DOCUMENTS

JP 5-190464 7/1993
JP 2729115 3/1998
(Continued)

OTHER PUBLICATIONS

Notification of Reasons for Refusal, issued by Korean Intellectual Property Office dated Mar. 19, 2013, in Korean Patent Application No. 2011-0049088, and its English language translation.
(Continued)

*Primary Examiner* — Rudy Zervigon
(74) *Attorney, Agent, or Firm* — Finnegan, Henderson, Farabow, Garrett & Dunner, L.L.P.

(57) ABSTRACT

It is an object of the present invention to provide a film-forming apparatus and a film-forming method that can prolong the lifetime of heaters used under high temperature conditions in an epitaxial growth technique. An inert gas discharge portion supplies an inert gas into the space containing the heater, gas is then discharged through the gas
(Continued)

discharge portion without influence on the semiconductor substrate during film formation. It is therefore possible to prevent the reaction gas entering into the space containing the high-temperature heaters. This makes it possible to prevent a reaction between hydrogen gas contained in the reaction gas and SiC constituting the heaters. Therefore, it is possible to prevent carbon used as a base material of the heaters from being exposed due to the decomposition of SiC and then reacting with hydrogen gas. This makes it possible to prolong the lifetime of the heaters.

4 Claims, 7 Drawing Sheets (51) Int. Cl.
C23C 16/458 (2006.01)
C23C 16/46 (2006.01)
C30B 25/10 (2006.01)

(52) U.S. Cl.
CPC .. *C23C 16/45519* (2013.01); *C23C 16/45557* (2013.01); *C23C 16/46* (2013.01); *C30B 25/10* (2013.01)

(58) Field of Classification Search
USPC ........................................ 118/715; 156/345.3
See application file for complete search history.

(56) References Cited

U.S. PATENT DOCUMENTS

| | | | | |
|---|---|---|---|---|
| 5,097,890 A * | 3/1992 | Nakao | C30B 25/10 | 118/724 |
| 5,443,648 A * | 8/1995 | Ohkase | C23C 16/54 | 118/715 |
| 5,445,676 A * | 8/1995 | Takagi | C23C 16/46 | 118/719 |
| 5,685,914 A * | 11/1997 | Hills | H01J 37/32449 | 118/723 E |
| 5,884,009 A * | 3/1999 | Okase | H01L 21/67017 | 219/405 |
| 6,036,482 A * | 3/2000 | Okase | H01L 21/67115 | 432/11 |
| 6,059,885 A * | 5/2000 | Ohashi | C23C 16/4401 | 118/715 |
| 6,113,705 A * | 9/2000 | Ohashi | C23C 16/4401 | 118/715 |
| 6,259,061 B1 * | 7/2001 | Osawa | H01L 21/67109 | 118/724 |
| 6,322,631 B1 * | 11/2001 | Okase | H01L 21/67109 | 118/708 |
| 6,537,924 B2 * | 3/2003 | Tobashi | C23C 16/24 | 118/715 |
| 6,627,859 B1 * | 9/2003 | Kasai | G05D 23/1902 | 219/438 |
| 6,869,641 B2 * | 3/2005 | Schmitt | C23C 16/4412 | 427/248.1 |
| 7,699,932 B2 * | 4/2010 | Miller | C23C 16/45544 | 118/715 |
| 7,967,912 B2 * | 6/2011 | Yajima | H01L 21/68792 | 118/725 |
| 8,080,767 B2 * | 12/2011 | Yamaga | H01L 21/67248 | 118/50.1 |
| 8,334,214 B2 * | 12/2012 | Suzuki | C23C 16/325 | 257/E21.092 |
| 8,375,891 B2 * | 2/2013 | Nagata | H01F 41/0293 | 118/719 |
| 8,815,711 B2 * | 8/2014 | Suzuki | B08B 17/02 | 257/E21.101 |
| 9,074,284 B2 * | 7/2015 | Fukuda | C23C 16/325 | |
| 9,139,933 B2 * | 9/2015 | Tsumori | C30B 25/12 | |
| 9,518,322 B2 * | 12/2016 | Ito | C30B 25/10 | |
| 9,598,792 B2 * | 3/2017 | Suzuki | C30B 25/10 | |
| 9,735,003 B2 * | 8/2017 | Yamada | H01L 21/02104 | |
| 2006/0175011 A1 | 8/2006 | Shinriki et al. | | |
| 2009/0142933 A1 * | 6/2009 | Yajima | H01L 21/67017 | 438/758 |
| 2009/0239362 A1 * | 9/2009 | Hirata | C23C 16/45591 | 438/509 |
| 2011/0039399 A1 * | 2/2011 | Suzuki | C23C 16/4586 | 438/478 |
| 2011/0200749 A1 * | 8/2011 | Suzuki | C23C 16/4402 | 427/255.5 |
| 2011/0206866 A1 * | 8/2011 | Suzuki | C23C 16/4557 | 427/587 |
| 2011/0265710 A1 * | 11/2011 | Suzuki | C23C 16/45519 | 117/85 |
| 2012/0028445 A1 * | 2/2012 | Suzuki | C23C 16/325 | 438/478 |
| 2012/0031330 A1 * | 2/2012 | Tsumori | C30B 25/12 | 118/708 |
| 2012/0048180 A1 * | 3/2012 | Ito | C23C 16/325 | 117/88 |
| 2012/0070577 A1 * | 3/2012 | Deura | C23C 16/4584 | 427/248.1 |
| 2012/0244684 A1 * | 9/2012 | Suzuki | C23C 16/45517 | 438/478 |
| 2012/0325138 A1 * | 12/2012 | Suzuki | C30B 25/10 | 117/88 |
| 2013/0036968 A1 * | 2/2013 | Suzuki | C30B 25/12 | 117/107 |
| 2013/0084390 A1 * | 4/2013 | Suzuki | G02B 21/241 | 427/248.1 |
| 2013/0247816 A1 * | 9/2013 | Suzuki | H01L 21/02529 | 117/86 |
| 2015/0090693 A1 * | 4/2015 | Ito | C30B 25/10 | 216/79 |
| 2015/0093894 A1 * | 4/2015 | Deura | F27B 17/0025 | 438/665 |
| 2015/0299898 A1 * | 10/2015 | Ito | C30B 23/063 | 427/249.15 |
| 2016/0024652 A1 * | 1/2016 | Ito | C23C 16/4588 | 427/249.15 |

FOREIGN PATENT DOCUMENTS

| | | |
|---|---|---|
| JP | 2004-22688 | 1/2004 |
| JP | 2005-109342 | 4/2005 |
| JP | 2008-108983 | 5/2008 |
| JP | 2009-135159 | 6/2009 |
| JP | 2010-56565 | 3/2010 |
| JP | 2010-153805 | 7/2010 |
| JP | 2011038149 A * | 2/2011 |
| KR | 10-2005-0073387 | 7/2005 |
| KR | 10-2006-0097138 | 9/2006 |
| KR | 10-2010-0050365 | 5/2010 |

OTHER PUBLICATIONS

Notification of Reasons for Rejection, issued by Japanese Patent Office dated Sep. 2, 2014, in Japanese Patent Application No. 2011-056995, and its English language translation.

* cited by examiner

FILM-FORMING MANUFACTURING APPARATUS AND METHOD

CROSS-REFERENCE TO THE RELATED APPLICATION

This is a division of U.S. patent application No. 13/196,309, filed on Aug. 2, 2011, which is based upon and claims benefit of priority from Japanese Patent Application No. 2010-190259, filed on Aug. 27, 2010 and Japanese Patent Application No. 2011-056995, filed on Mar. 15, 2011, all of which are incorporated herein by reference in their entirety.

FIELD OF THE INVENTION

The present invention relates to a film-forming manufacturing apparatus and method.

BACKGROUND

Epitaxial growth technique is conventionally used to produce a semiconductor device such as a power device (e.g., IGBT (Insulated Gate Bipolar Transistor)) requiring a relatively-thick crystalline film.

In the case of vapor phase epitaxy used in epitaxial growth technique, a wafer is placed inside a film-forming chamber maintained at atmospheric pressure or a reduced pressure, and a reaction gas is supplied into the film-forming chamber while the wafer is heated. As a result, a pyrolytic reaction or a hydrogen reduction reaction of the reaction gas occurs on the surface of the wafer so that an epitaxial film is formed on the wafer.

In order to produce a thick epitaxial film in high yield, a fresh reaction gas needs to be continuously brought into contact with the surface of a uniformly-heated wafer to increase a film-forming rate. Therefore, in the case of a conventional film-forming apparatus, a film is epitaxially grown on a wafer while the wafer is rotated at a high speed (see, for example, Japanese Patent Application Laid-Open No. 2008-108983).

In order to form a silicon (Si) epitaxial film on a wafer, a mixture gas obtained by mixing a silicon (Si) source gas such as silane ($SiH_4$) or dichlorosilane ($SiH_2Cl_2$), a small amount of dopant gas such as diborane ($B_2H_6$) and phosphine ($PH_3$), and a carrier gas such as hydrogen (H2) gas is used as the reaction gas.

In recent years, attention has been given to SiC (silicon carbide) epitaxial growth technique. SiC is characterized in that its energy gap is two or three times larger and its dielectric breakdown field is about one digit larger than that of a conventional semiconductor material such as Si (silicon) or GaAs (gallium arsenide). For this reason, SiC is a semiconductor material expected to be used in high-voltage power semiconductor devices.

In order to obtain a SiC single-crystalline thin film by epitaxial growth of SiC, a mixture gas obtained by mixing, for example, a silicon (Si) source gas such as silane ($SiH_4$) or dichlorosilane ($SiH_2Cl_2$), a carbon source gas such as propane ($C_3H_8$) or acetylene ($C_2H_2$), and a carrier gas such as hydrogen ($H_2$) gas, is used as the reaction gas. Further, in order to form a SiC film on a substrate by epitaxial growth, the substrate needs to be heated to a temperature of 1500° C. or higher. Therefore, a heater for heating a wafer is made of a high heat-resistance material. More specifically, a heater obtained by coating a carbon (C) base material with SiC by CVD (Chemical Vapor Deposition) is used.

It is known that a reaction between SiC and hydrogen gas occurs under high temperature. Therefore, if the reaction gas comes into contact with the heater during epitaxial growth of SiC, SiC that covers the surface of the heater reacts with hydrogen gas contained in the reaction gas and is decomposed. As a result, carbon as a base material of the heater is exposed and reacts with hydrogen gas according to the following equation:

Such a reaction between the base material of the heater of the film-forming apparatus and hydrogen gas degrades and shortens the lifetime of the heater.

In view of the above problem, it is an object of the present invention to provide a film-forming apparatus that can prolong the lifetime of a heater and can be used under high temperature, and a film-forming method that makes it possible to prolong the lifetime of a heater and to perform film formation under high temperature.

Other challenges and advantages of the present invention are apparent from the following description.

SUMMARY OF THE INVENTION

The present invention relates to a film-forming manufacturing apparatus and method, in one aspect of this invention, an apparatus comprising: a film-forming chamber, a reaction gas supply portion, a susceptor provided in the film-forming chamber to place a substrate thereon, an upper heater located above the susceptor, and a lower heater located below the susceptor, an upper liner, functioning as a channel through which the reaction gas flows downward from the reaction gas supply portion toward the susceptor, a lower liner provided with an opening for placing the substrate on to the susceptor, a lifting system positioned outside the film-forming chamber, for controlling lifting and lowering of the lower liner section.

In another aspect of this invention, a film-forming apparatus comprising: a film-forming chamber, a hollow liner provided in the film-forming chamber, a susceptor provided in the film-forming chamber to place a substrate thereon, a heater located below the susceptor, a reaction gas supply portion for supplying a reaction gas, a first inert gas supply portion that supplies an inert gas into a space around the susceptor, a second inert gas supply portion that supplies an inert gas into a space around the heater, a inert gas discharge portion for discharging the second inert gas from a space around the heater, and a gas discharge portion, through which reaction gas, the first inert gas and the second inert gas are discharged outside the film-forming chamber.

In another aspect of this invention, a film-forming method comprising: placing a substrate on a susceptor within a film-forming chamber, and supplying a reaction gas into the film-forming chamber while the substrate is heated by an upper heater provided above the substrate, and a lower heater provided below the substrate to form a predetermined film on the substrate, the lower heater is kept under an inert gas atmosphere via supplied inert gas, wherein a pressure in a first space around the susceptor is kept at a lower pressure than a pressure in a second space around the upper heater and a pressure in a third space around the lower heater, the inert gas used to create the inert gas atmosphere and the reaction gas used to form a predetermined film are then discharged from a fourth space of the film-forming chamber.

DETAILED DESCRIPTION OF THE EMBODIMENT

An embodiment of the present invention will be described with reference to a case where a SiC epitaxial film is formed, but the present invention is not limited thereto. For example, the present invention can also be applied to formation of a Si epitaxial film.

As described above, a carbon material constituting a heater of a film-forming apparatus reacts with hydrogen in a high-temperature environment according to, for example, the following equation:

Further, in a high-temperature environment of 1000° C. or higher, $CH_4$ is further decomposed, and $C_2H_2$, $CH_3$, and $C_2H_3$ are also generated.

When the above-described reaction occurs, the heater is degraded and its lifetime is shortened. For this reason, it is necessary to prevent the heater from coming into contact with a reaction gas containing hydrogen gas. This is particularly important when a SiC epitaxial film is formed because the above-described reaction notably occurs under high temperature.

Figure 1:
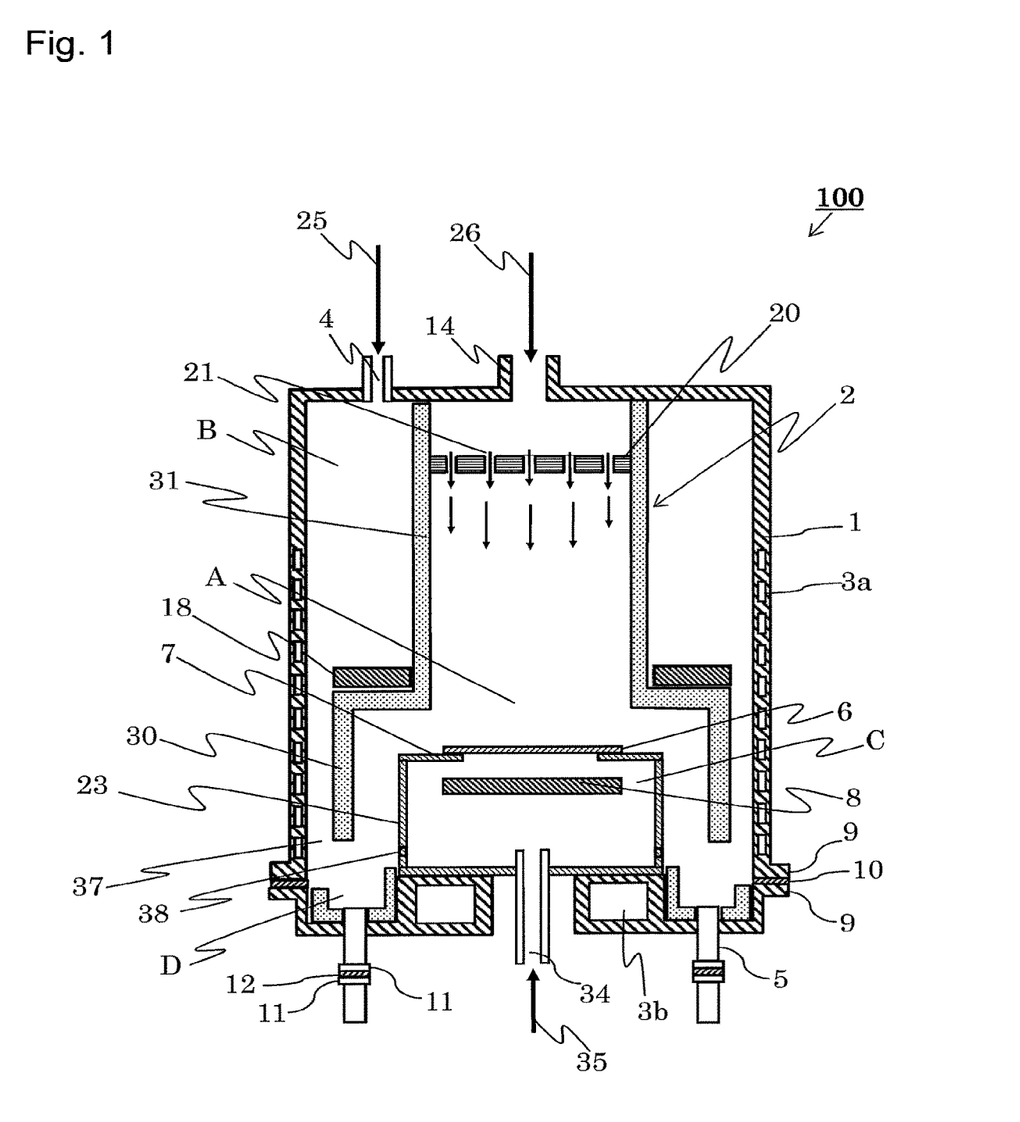
FIG. 1 is a schematic sectional view of a film-forming apparatus according to this embodiment.

FIG. 1 is a schematic sectional view of a film-forming apparatus according to this embodiment.

A film-forming apparatus 100 shown in FIG. 1 can be used for forming a SiC film. In this case, a SiC wafer can be used as a semiconductor substrate 6. However, the semiconductor substrate 6 is not limited thereto, and in some cases, a wafer made of another material may be used. For example, a Si wafer maybe used instead of the SiC wafer, and alternatively, another insulating substrate such as $SiO_2$ (quartz) or a semi-insulating substrate such as high-resistance GaAs may be used.

The film-forming apparatus 100 includes a chamber 1 as a film-forming chamber, a hollow cylindrical liner 2, channels 3a and 3b of cooling water for cooling the chamber 1, a first inert gas supply portion 4 and a second inert gas supply portion 34 for introducing an inert gas 25 and an inert gas 35 into the chamber 1, a reaction gas supply portion 14 for introducing a reaction gas 26 into the chamber 1, a gas discharge portion 5 through which the reaction gas 26 after reaction is discharged outside the chamber 1, a susceptor 7 on which the semiconductor substrate 6, such as a wafer, is to be placed to support it, a lower heater 8 and an upper heater 18 that are supported by support units (not shown) and heat the semiconductor substrate 6, a flange portion 9 connecting upper and lower parts of the chamber 1 to each other, a gasket 10 that seals the flange portion 9, a flange portion 11 through which the gas discharge portion 5 and a pipe are connected to each other, and a gasket 12 that seals the flange portion 11.

The liner 2 is made of a material having very high heat resistance. As one example, a member formed by coating carbon with SiC can be used. The liner 2 has a head part 31 having an opening, and a shower plate 20 fitted into the opening. The shower plate 20 also functions as a gas straightening vane for uniformly supplying the reaction gas 26 onto the surface of the semiconductor substrate 6. This shower plate 20 has a plurality of through holes 21 for supplying the reaction gas 26.

The reason why the liner 2 is provided is that the wall of a chamber generally used in a film-forming apparatus is made of stainless steel. That is, the film-forming apparatus 100 uses the liner 2 to prevent the wall made of stainless steel from being exposed to a gas-phase reaction. The liner 2 has the effect of preventing deposition of particles on the wall of the chamber 1, contamination of the wall of the chamber 1 with metals, or erosion of the wall of the chamber 1 by the reaction gas 26 during formation of a crystalline film.

The liner 2 has a hollow cylindrical form, and includes a body part 30, in which the susceptor 7 is located, and the head part 31 whose inner diameter is smaller than that of the body part 30.

On the susceptor 7, the semiconductor substrate 6 is to be placed. The susceptor 7 is attached to the upper end portion of a hollow cylindrical rotating cylinder 23. The rotating cylinder 23 is connected to a rotating system (not shown) through a rotating shaft (not shown) extending from the bottom of chamber 1. That is, the susceptor 7 is rotatably located above the lower heater 8 and inside the body part 30 of the liner 2. Therefore, the semiconductor substrate 6 placed on the susceptor 7 is rotated at high speed by rotating the susceptor 7 during a gas-phase growth reaction.

In order to form a SiC epitaxial film on the semiconductor substrate 6, a mixture gas obtained by mixing a silicon (Si) source gas such as silane ($SiH_4$) or dichlorosilane ($SiH_2Cl_2$), a carbon (C) source gas such as propane ($C_3H_8$) or acetylene ($C_2H_2$), and a carrier gas such as hydrogen ($H_2$) gas is used as the reaction gas 26. The mixture gas is introduced from the reaction gas supply portion 14 of the film-forming apparatus 100. More specifically, the mixture gas is introduced into the liner 2, that is, into a first space (space A) extending from the reaction gas supply portion 14 to an area around the semiconductor substrate 6.

As described above, the shower plate 20 is fitted into the upper opening of the head part 31 of the liner 2. The shower plate 20 is used to uniformly supply the reaction gas 26 onto the surface of the semiconductor substrate 6 placed on the susceptor 7 inside the body part 30.

The size of the inner diameter of the head part 31 of the liner 2 is determined to correspond to the size of the semiconductor substrate 6 in consideration of the arrangement of the through holes 21 of the shower plate 20. This makes it possible to reduce wasted space where the reaction gas 26 that has passed through the through holes 21 of the shower plate 20 diffuses. That is, the film-forming apparatus 100 is configured so that the reaction gas 26 supplied through the shower plate 20 can be efficiently focused on the surface of the semiconductor substrate 6 without wasting the reaction gas 26. Further, in order to allow the reaction gas 26 to flow more uniformly on the surface of the semiconductor substrate 6, the film-forming apparatus 100 is configured so that the gap between the periphery of the semiconductor substrate 6 and the liner 2 can be minimized.

By using the liner 2 having such a structure as described above, it is possible to allow a gas-phase growth reaction to efficiently proceed on the surface of the semiconductor substrate 6. More specifically, the reaction gas 26 supplied to the reaction gas supply portion 14 is straightened in the space A when passing through the through holes 21 of the shower plate 20, and flows downward substantially vertically toward the semiconductor substrate 6 located under the shower plate 20. That is, the reaction gas 26 forms a vertical flow in a region extending from the shower plate 20 to the surface of the semiconductor substrate 6. Then, the reaction gas 26 is brought into contact with the semiconductor substrate 6. Then, the reaction gas 26 flows without turbulence as a substantially laminar flow in a horizontal direction along the upper surface of the semiconductor substrate 6. As described above, since the reaction gas 26 is in a straightened state on the surface of the semiconductor substrate 6, an epitaxial film having high thickness uniformity and high quality can be formed.

The reaction gas 26 supplied onto the surface of the semiconductor substrate 6 in such a manner as described above causes a pyrolytic reaction or a hydrogen reduction reaction on the surface of the semiconductor substrate 6. This makes it possible to form an epitaxial film on the surface of the semiconductor substrate 6. The reaction gas 26 not used for a gas-phase growth reaction is turned into a denatured production gas and discharged through the gas discharge portion 5 in the lower part of the chamber 1.

In the film-forming apparatus 100 shown in FIG. 1, the flange portion 9 of the chamber 1 is sealed with the gasket 10 and the flange portion 11 of the gas discharge portion 5 is sealed with the gasket 12. As the gaskets 10 and 12, those made of fluorine rubber are preferably used, but their upper temperature limits are about 300° C. According to this embodiment, the channels 3a and 3b of cooling water for cooling the chamber 1 are provided to prevent the gaskets 10 and 12 from being thermally degraded.

The film-forming apparatus 100 shown in FIG. 1 has upper heater 18 and a lower heater 8 as means for heating the semiconductor substrate 6 placed inside the liner 2.

The upper heater 18 is a resistive heater formed by coating the surface of a carbon base material with a SiC material. The upper heater 18 is located in a second space (space B) created between the liner 2 and the inner wall of the chamber 1. From the viewpoint of efficiently heating the semiconductor substrate 6, the upper heater 18 is located near the semiconductor substrate 6, more specifically, near the junction between the body part 30 and the head part 31 of the liner 2.

Similarly to the upper heater 18, the lower heater 8 is also a resistive heater formed by coating the surface of a carbon base material with a SiC material. The lower heater 8 is located in a third space (space C) that is a space under the susceptor 7, on which the semiconductor substrate 6 is to be placed, and inside the rotating cylinder 23.

In the upper part of chamber 1 of the film-forming apparatus 100 according to this embodiment, the first inert gas supply portion 4 is provided separately from the reaction gas supply portion 14 to supply the inert gas 25 into the space B as a purge gas. As described above, the upper heater 18 is positioned in the space B. By supplying the inert gas 25 from the first inert gas supply portion 4 into the space B, an area around the upper heater 18 is purged by the inert gas 25. A portion between the lower end of the body part 30 of the liner 2 and the inner wall of the chamber 1 functions as a discharge portion (first inert gas discharge portion 37) for discharging the inert gas supplied from the first inert gas supply portion 4. That is, when supplied from the first inert gas supply portion 4, the inert gas 25 flows downward through the space B toward the first inert gas discharge portion 37 while purging an area around the upper heater 18. Then, the inert gas 25 is discharged through the gas discharge portion 5.

Further, in the film-forming apparatus 100, the second inert gas supply portion 34 is located at the bottom of the chamber 1. The second inert gas supply portion 34 supplies the inert gas 35 as a purge gas into the space C inside the rotating cylinder 23.

Figure 2:
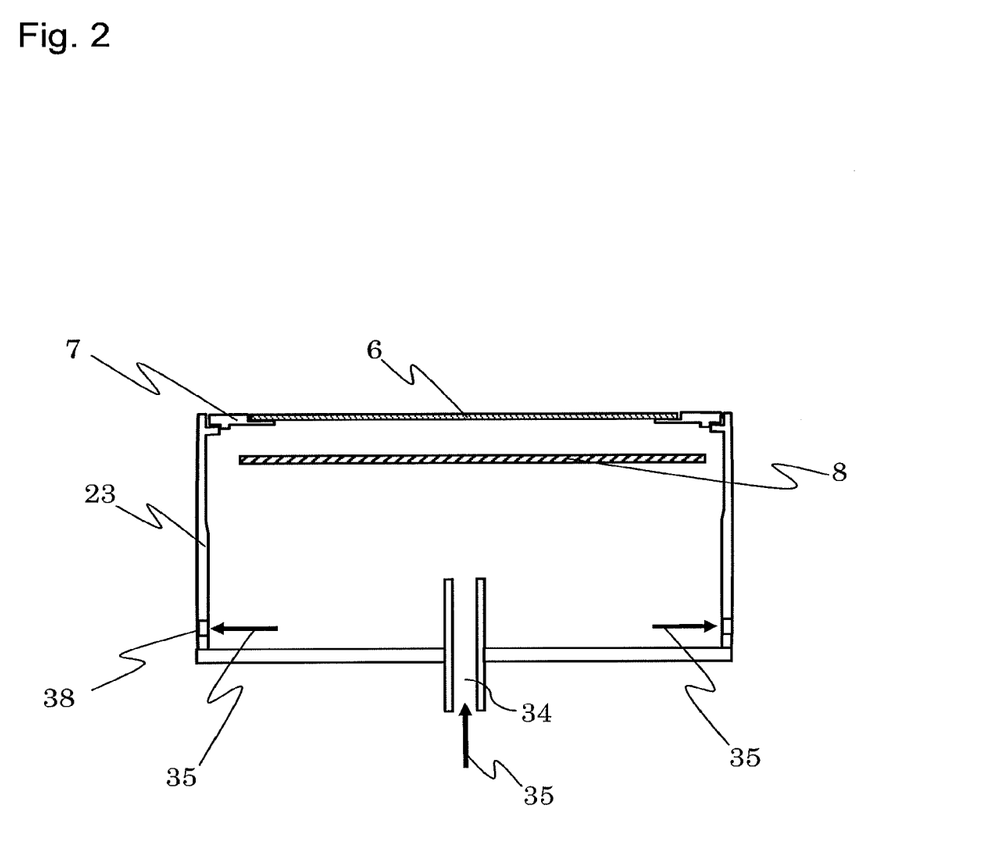
FIG. 2 is a schematic sectional view showing the structure of the rotating cylinder and the surrounding film-forming apparatus according to this embodiment.

FIG. 2 is a schematic sectional view showing the structure of the rotating cylinder and the surrounding film-forming apparatus according to this embodiment.

As shown in FIGS. 1 and 2, the rotating cylinder 23 has a second inert gas discharge portion 38 penetrating the side wall thereof, said second inert gas discharge portion 38 is located near the bottom of the rotating cylinder 23. The second inert gas discharge portion 38 is for discharging the inert gas 35 supplied into the space C. As described above, the lower heater 8 is located in the space C. The inert gas 35 supplied from the second inert gas supply portion 34 purges an area around the lower heater 8, and is then discharged through the second inert gas discharge portion 38 to the outside of the space C and then discharged through the gas discharge portion 5 without influence on the semiconductor substrate 6 during film formation.

As the inert gas 25 or 35, at least one selected from the group consisting of helium (He) gas, neon (Ne) gas, argon (Ar) gas, krypton (Kr) gas, and xenon (Xe) gas can be used. Among these, argon gas is preferably used because argon gas is a purge gas that is easy to use.

As described above, since the film-forming apparatus 100 according to this embodiment includes the gas supply portions (first inert gas supply portion 4 and second inert gas supply portion 34) provided separately from the reaction gas supply portion 14, gases different from the reaction gas 26 can be introduced into the chamber 1. This makes it possible to introduce the inert gas 25 and the inert gas 35 into an area around the upper heater 18 and an area around the lower heater 8 in the chamber 1 to keep both the upper heater 18 and the lower heater 8 under an inert gas atmosphere.

The space B to be purged with the inert gas 25 communicates with the space A via the first inert gas discharge portion 37. The space C to be purged with the inert gas 35 communicates with the space A via the second inert gas discharge portion 38. Therefore, if the purge of space B with the inert gas 25 and purge of space C with the inert gas 35 is unsatisfactorily performed, there is a fear that the reaction gas 26 supplied into space A enters the space B and the space C through the first inert gas discharge portion 37 and the second inert gas discharge portion 38.

In order to prevent the entry of the reaction gas 26 into the space B and the space C, the pressure in the space B and the pressure in the space C are made higher than the pressure in the space A. That is, the pressure in the space A (P1) and the pressure in the space B (P2) are set so that the relationship P1<P2 is satisfied. Further, the pressure in the space A (P1) and the pressure in the space C (P3) are set so that the relationship P1<P3 is satisfied. More specifically, a pressure meter is provided in each of the spaces A, B, and C so that the pressures in the spaces A, B, and C can be measured, and the flow rate of the inert gas 25 supplied into the space B and the flow rate of the inert gas 35 supplied into the space C are adjusted so that the relationship P1<P2 and the relationship P1<P3 are satisfied.

By controlling the flow rate of the inert gas 25 and the flow rate of the inert gas 35 in such a manner as described above, it is possible to prevent the reaction gas 26 introduced into the space A from entering into the space B and the space C and coming into contact with the high-temperature upper heater 18 and lower heater 8. This makes it possible to prevent a reaction between hydrogen gas contained in the reaction gas 26 and SiC constituting the upper heater 18 and the lower heater 8. Therefore, it is also possible to prevent carbon as a base material of the heaters from being exposed due to the decomposition of SiC and then reacting with hydrogen gas. This makes it possible to prolong the lifetime of the heaters.

Further, according to this embodiment, the pressure in a fourth space (space D) near the gas discharge portion (P4), the pressure in the space A (P1), the pressure in the space B (P2), and the pressure in the space C (P3) are set so that the following relationships are satisfied:

P4<P1

P4<P2

P4<P3

The gases introduced into the space A, the space B, and the space C, join together in the space D. In the process of forming a film in the chamber 1 at a pressure near the atmospheric pressure, the speed of discharging the gases is low and therefore a pressure gradient is less likely to be created between the gas supply portions and the gas discharge portion in the chamber 1. Therefore, there is a fear that when the inert gases are supplied into the space B and the space C, the pressures in the spaces A, B, and C become equal to the pressure in the space D or the pressure in the space D becomes higher than the pressures in the spaces A, B, and C. In this case, retention of the gases in the space D occurs or, in some cases, the gases that should be discharged flow backward into the chamber 1. Therefore, in order to smoothly discharge the gases from the space D, the amounts of the gases supplied into the spaces A, B, and C are adjusted so that the above-described relationships are satisfied.

Hereinbelow, a film-forming method according to this embodiment will be described with reference to a case where a SiC film is formed using the film-forming apparatus 100 shown in FIG. 1.

First, the semiconductor substrate 6 is transported into the chamber 1 and placed on the susceptor 7. Then, the semiconductor substrate 6 placed on the susceptor 7 is rotated at about 50 rpm by rotating the rotating cylinder 23 and the susceptor 7.

The upper heater 18 and the lower heater 8 are activated by supplying an electric current to heat the semiconductor substrate 6 by heat emitted from the upper heater 18 and the lower heater 8. The semiconductor substrate 6 is gradually heated until the temperature of the semiconductor substrate 6 reaches a predetermined temperature between 1500° C. and 1700° C. (e.g., 1600° C.) at which a film is formed. At this time, the temperature of the upper heater 18 and the temperature of the lower heater 8 reaches a temperature of about 1800° C. Therefore, cooling water is allowed to flow through the channels 3a and 3b provided in the wall of the chamber 1 to prevent the chamber 1 from being excessively heated.

After reaching 1600° C., the temperature of the semiconductor substrate 6 is carefully adjusted to around 1600° C. by the lower heater 8. At this time, the temperature of the semiconductor substrate 6 is measured using a radiation thermometer (not shown) attached to the film-forming apparatus. After it is confirmed that the temperature of the semiconductor substrate 6 has reached a predetermined temperature by measurement using the radiation thermometer, the number of revolutions of the semiconductor substrate 6 is gradually increased. The number of revolutions of the semiconductor substrate 6 may be increased to, for example, about 900 rpm.

As described above, according to this embodiment, the pressure in the space B and the pressure in the space C are made higher than the pressure in the space A to prevent the entry of the reaction gas 26 into the space B and the space C. That is, the pressure in the space A (P1) and the pressure in the space B (P2) are set so that the relationship P1<P2 is satisfied, and the pressure in the space A (P1) and the pressure in the space C (P3) are set so that the relationship P1<P3 is satisfied. Further, in order to prevent the backflow of the gases from the space D to the spaces A, B, and C, the pressure in the space D (P4) is also set so that the relationships P4<P1, P4<P2, and P4<P3 are satisfied. For example, the pressure in the space A may be set to 13.33 kPa, the pressure in the space B and the pressure in the space C may be set to 13.34 kPa, and the pressure in the space D may be set to 13.32 kPa.

The reaction gas 26 is supplied from the reaction gas supply portion 14, and is allowed to flow downward through the shower plate 20 toward the surface of the semiconductor substrate 6 placed in the body part 30 of the liner 2. At this time, the reaction gas 26 is straightened when passing through the through holes 21 of the shower plate 20, and flows downward substantially vertically toward the semiconductor substrate 6 located under the shower plate 20. That is, the reaction gas 26 forms a so-called vertical flow. The flow rate of the reaction gas 26 may be set to, for example, 70 L/min.

Concurrently with the supply of the reaction gas 26, argon gas as an inert gas is supplied from the first inert gas supply portion 4 into the space B to keep the high-temperature upper heater 18 located in the space B under an argon gas atmosphere. The flow rate of argon gas may be set to, for example, 10 L/min.

Further, concurrently with the supply of the reaction gas 26, argon gas as an inert gas is supplied also into the space C to keep the lower heater 8 in the space C under an argon gas atmosphere. The flow rate of argon gas may be set to, for example, 10 L/min.

In this way, an inert gas is supplied to the space B and the space C to keep the upper heater 18 in the space B and the lower heater 8 in the space C under an inert gas atmosphere and to make the pressure in the space B (P2) and the pressure in the space C (P3) higher than the pressure in the space A (P1). This makes it possible to prevent the reaction gas 26 in the space A from entering into the space B and the space C and coming into contact with the upper heater 18 and the lower heater 8.

Figure 3:
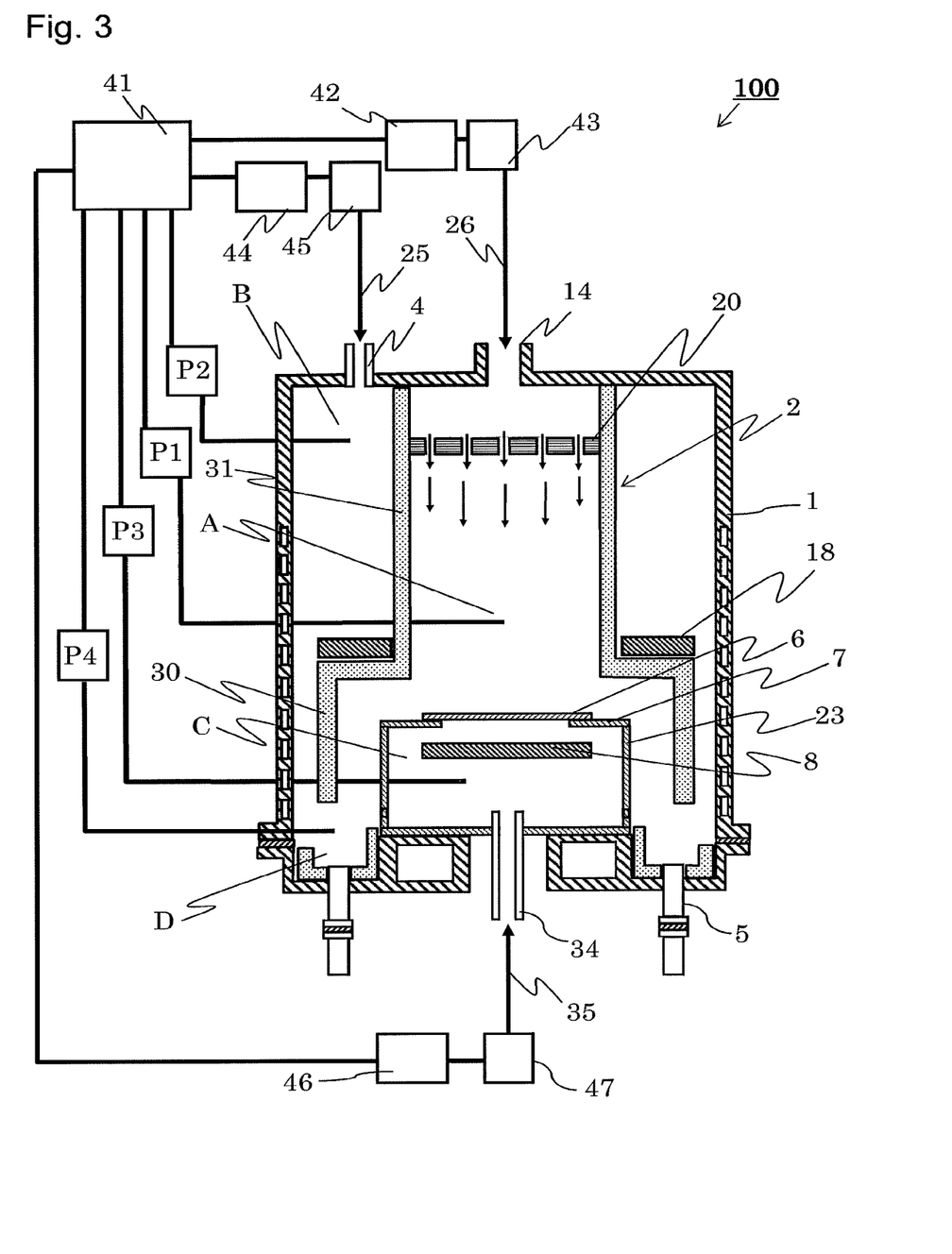
FIG. 3 is a schematic diagram for explaining a method for controlling the pressures in the spaces A, B, and C and the flow rates of gases to be supplied to these spaces.

FIG. 3 is a schematic diagram for explaining a method for controlling the pressures in the spaces A, B, and C and the flow rates of gases to be supplied to these spaces with reference to the film-forming apparatus 100 shown in FIG. 1.

As shown in FIG. 3, the pressures in the spaces A, B, and C and the pressure in the space D (P4) can be measured by pressure meters 901, 902, 903, and 904, respectively.

The flow rates of gases to be supplied into the spaces A, B, and C are measured by flowmeters 43, 45, and 47, respectively. More specifically, the reaction gas 26 is supplied from a tank 42 containing the reaction gas 26 into the space A through the reaction gas supply portion 14. The flow rate of the reaction gas 26 at this time is measured by the flowmeter 43. The inert gas 25 is supplied from a tank 44 containing the inert gas 25 into the space B through the first inert gas supply portion 4. The flow rate of the inert gas 25 at this time is measured by the flowmeter 45. The inert gas 35 is supplied from a tank 46 containing the inert gas 35 into the space C through the second inert gas supply portion 34. The flow rate of the inert gas 35 at this time is measured by the flowmeter 47.

The pressure meters 901, 902, 903, and 904 and the flowmeters 43, 45, and 47 are connected to a control unit 41. The flow rates of the gases and the pressures in the spaces A, B, and C are controlled by the control unit 41 so that the following relationships are satisfied:

$P1<P2$ $P1<P3$ $P4<P1$ $P4<P2$ $P4<P3$

By using the above method, it is possible to keep the space B and the space C under an inert gas atmosphere and to prevent the entry of the reaction gas 26 from the space A into the space B and the space C. This makes it possible to prevent a reaction between hydrogen gas contained in the reaction gas 26 and SiC constituting the upper heater 18 and the lower heater 8. Therefore, it is also possible to prevent carbon as a base material of the upper heater 18 and the lower heater 8 from being exposed due to the decomposition of SiC and then from reacting with hydrogen gas. This makes it possible to prolong the lifetime of the heaters. In addition, it is also possible to prevent backflow of the gases from the space D to the spaces A, B, and C. This makes it possible to smoothly discharge the gases.

The reaction gas 26 supplied into the space A flows downward through the head part 31 and the body part 30 of the liner 2 toward the semiconductor substrate 6 so that the reaction gas 26 on the semiconductor substrate 6 is in a straightened state. When reaching the surface of the heated semiconductor substrate 6, the reaction gas 26 causes a pyrolytic reaction or a hydrogen reduction reaction so that a SiC epitaxial film is formed on the surface of the semiconductor substrate 6.

When the thickness of the SiC epitaxial film reaches a predetermined value, the supply of the reaction gas 26 is stopped. At this time, the supply of hydrogen gas used as a carrier gas may be continued. In this case, the supply of hydrogen gas as a carrier gas may be stopped after it is confirmed that the temperature of the semiconductor substrate 6 measured by the radiation thermometer (not shown) has become lower than a predetermined value. The supply of the inert gas 25 and the inert gas 35 is stopped after the supply of the reaction gas 26 is stopped to prevent the entry of the reaction gas 26 into the space B and the space C.

After it is confirmed that the semiconductor substrate 6 has been cooled to a predetermined temperature, the semiconductor substrate 6 is transported to the outside of the chamber 1.

As described above, according to this embodiment, a SiC epitaxial film is formed on the semiconductor substrate 6 in a state where the high-temperature upper heater 18 and lower heater 8 are both kept under an inert gas atmosphere. Such a film-forming method makes it possible to prevent the upper heater 18 and the lower heater 8 from being degraded by the action of hydrogen gas contained in the reaction gas 26. That is, it is possible to prolong the lifetime of the upper heater 18 and the lower heater 8.

The film-forming apparatus and film-forming method according to this embodiment have been described above with reference to a case where a SiC epitaxial film is formed. However, the present invention is not limited thereto, and can be applied also to, for example, formation of another epitaxial film such as a Si epitaxial film. In the case of formation of a Si epitaxial film, the temperature of the surface of a semiconductor substrate is set to about 1100° C. Therefore, when the film-forming apparatus 100 described above is used to form a Si epitaxial film, the upper heater 18 may be omitted.

Figure 4:
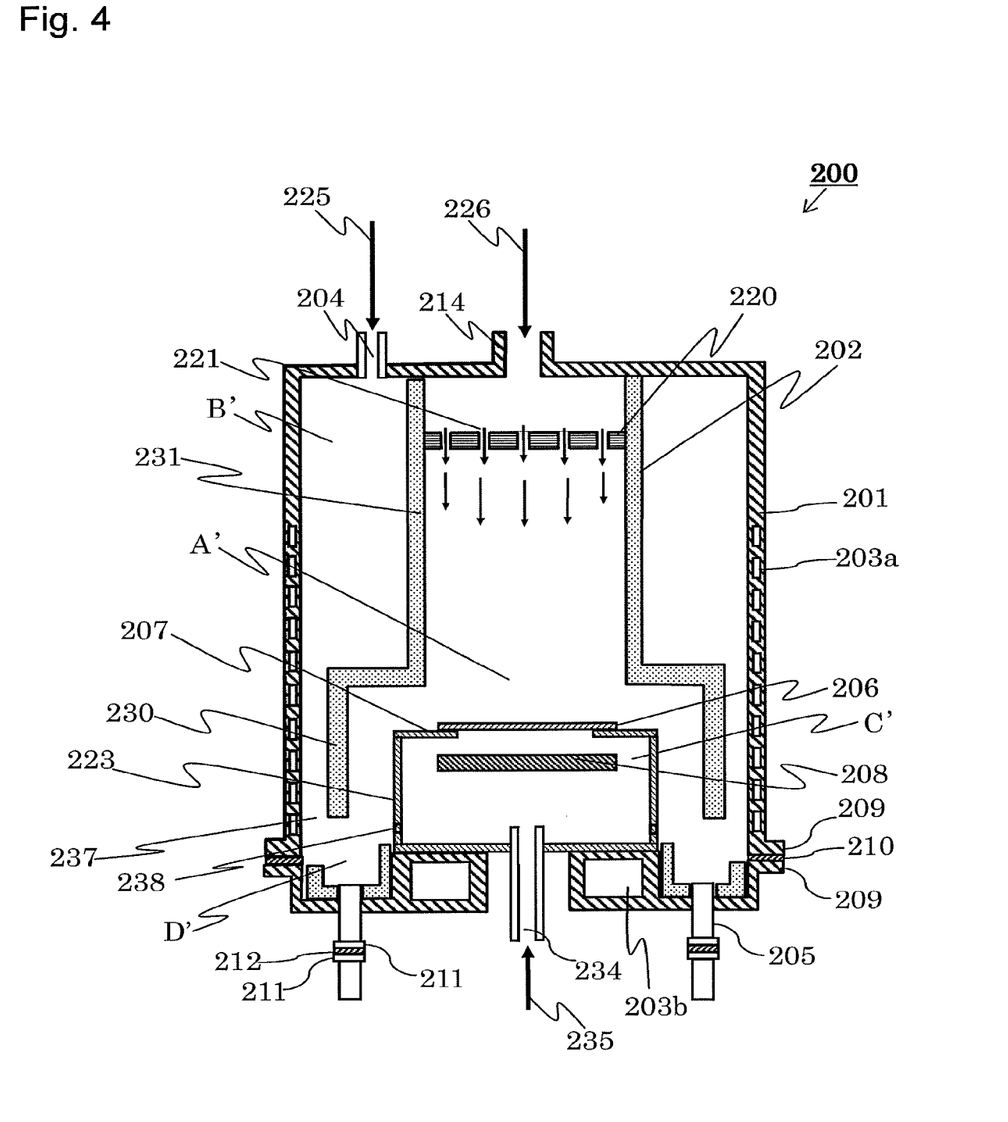
FIG. 4 is a schematic diagram of another example of the film-forming apparatus according to this embodiment.

FIG. 4 is a schematic diagram of another example of the film-forming apparatus according to this embodiment.

In a film-forming apparatus 200 shown in FIG. 4, an upper heater is not provided in the space B' created between a liner 202 and the inner wall of a chamber 201, and only a lower heater 208 is provided in the space C' under a susceptor 207, on which a semiconductor substrate 206 is to be placed, and inside a rotating cylinder 223. It is to be noted that the structure of the film-forming apparatus 200 is the same as that of the film-forming apparatus 100 shown in FIG. 1 except that the film-forming apparatus 200 does not include an upper heater.

That is, the film-forming apparatus 200 includes the chamber 201 as a film-forming chamber, the liner 202, channels 203a and 203b, a first inert gas supply portion 204 and a second inert gas supply portion 234 for introducing an inert gas 225 and an inert gas 235, a reaction gas supply portion 214 for introducing a reaction gas 226, a gas discharge portion 205, the susceptor 207, the lower heater 208, flange portions 209 and 211, and gaskets 210 and 212.

The hollow cylindrical liner 202 includes a body part 230, in which the susceptor 207 is located, and a head part 231 whose inner diameter is smaller than that of the body part 230. The head part 231 of the liner 202 has an opening, and a shower plate 220 having through holes 221 is fitted into the opening. The susceptor 207 is attached to the upper end portion of the rotating cylinder 223. On the susceptor 207, the semiconductor substrate 206 is to be placed.

When supplied from the reaction gas supply portion 214 into space A', the reaction gas 226 reaches the surface of the semiconductor substrate 206 and is used for a gas-phase growth reaction. The reaction gas 226 other than that used for the reaction is discharged through the gas discharge portion 205.

As described above, the film-forming apparatus 200 shown in FIG. 4 includes the lower heater 208 as a means for heating the semiconductor substrate 206. As the lower heater 208, a resistive heater formed by coating the surface of a carbon base material with a SiC material is used. The lower heater 208 is located under the susceptor 207 in the space C', inside the rotating cylinder 223.

In the upper part of the chamber 201 of the film-forming apparatus 200, the first inert gas supply portion 204 is provided separately from the reaction gas supply portion 214 to supply an inert gas into the space B' as a purge gas. Further, a first inert gas discharge portion 237 is provided at the lower end of the body part 230 of the liner 202.

Therefore, when supplied from the first inert gas supply portion 204, the inert gas 225 flows downward through the space B' toward the first inert gas discharge portion 237 and is then discharged through the gas discharge portion 205.

Further, in the film-forming apparatus 200, the second inert gas supply portion 234 is provided at the bottom of the chamber 201. The second inert gas supply portion 234 supplies the inert gas 235 into the space C' as a purge gas. The supplied inert gas 235 purges an area around the lower heater 208, and is then discharged to the outside of the space C' through a second inert gas discharge portion 238 provided in the rotating cylinder 223.

As the inert gas 225 or 235 used as a purge gas, at least one selected from the group consisting of helium (He) gas, neon (Ne) gas, argon (Ar) gas, krypton (Kr) gas, and xenon (Xe) gas can be used. Among them, argon gas is preferably used because of the ease of use.

It is to be noted that since the film-forming apparatus 200 does not include an upper heater, hydrogen gas may be introduced into the space B' instead of an inert gas such as argon gas. In this case, however, an inert gas such as argon gas is selected as a gas to be supplied into the space C' to prevent a reaction between a member constituting the lower heater 208 and hydrogen gas.

As described above, since the film-forming apparatus 200 includes the gas supply portions (first inert gas supply portion 204 and second inert gas supply portion 234) provided separately from the reaction gas supply portion 214, gases different from the reaction gas 226 can be introduced into the chamber 201. This makes it possible to introduce the inert gas 225 and the inert gas 235 into the space B' between the liner 202 and the inner wall of the chamber 201 and the space C' around the lower heater 208 to keep these spaces under an inert gas atmosphere for the purpose of purge.

At this time, the space B' purged with the inert gas 225 and the space C' purged with the inert gas 235 communicate with the space A' through the first inert gas discharge portion 237 and the second inert gas discharge portion 238, respectively. Therefore, the pressure in the space A' (P5) and the pressure in the space B' (P6) are set so that the relationship P5<P6 is satisfied. Further, the pressure in the space A' (P5) and the pressure in the space C' (P7) are set so that the relationship P5<P7 is satisfied.

More specifically, the flow rate of the inert gas 225 to be supplied into the space B' and the flow rate of the inert gas 235 to be supplied to the space C' are controlled. This makes it possible to prevent the reaction gas 226 introduced into the space A' from entering into the space B' and the space C'. That is, it is possible to prevent the reaction gas 226 from entering into the space B', and eroding the wall of the chamber 201. In addition, it is also possible to prevent the reaction gas 226 from entering into the space C' and coming into contact with the high-temperature lower heater 208. This makes it possible to prevent hydrogen gas contained in the reaction gas 226 from reacting with a SiC material constituting the lower heater 208, and by extension, with a carbon material constituting the lower heater 208, thereby preventing the degradation of the lower heater 208.

Further, in the film-forming apparatus 200, the pressure in space D' near the gas discharge portion (P8), the pressure in the space A' (P5), the pressure in the space B' (P6), and the pressure in the space C' (P7) are set so that the following relationships are satisfied:

P8<P5

P8<P6

P8<P7

The gases introduced into the space A', the space B', and the space C' join together in the space D'. In the process of forming a film in the chamber 201 at a pressure near the atmospheric pressure, the speed of discharging the gases is low, and therefore a pressure gradient is less likely to be created between the gas supply portions and the gas discharge portion in the chamber 201. Therefore, there is a fear that when an inert gas is supplied into the space B' and the space C', the pressures in the spaces A', B', and C' become equal to the pressure in the space D' or the pressure in the space D' becomes higher than the pressures in the spaces A', B', and C'. In this case, retention of the gases in the space D' occurs or, in some cases, the gases that should be discharged flow backward into the chamber 201. Therefore, in order to smoothly discharge the gases from the space D', the amounts of the gases supplied into the spaces A, B, and C are adjusted so that the above-described relationships are satisfied.

It is to be noted that the present invention is not limited to the above embodiment, and various changes may be made without departing from the scope of the present invention.

Figure 5:
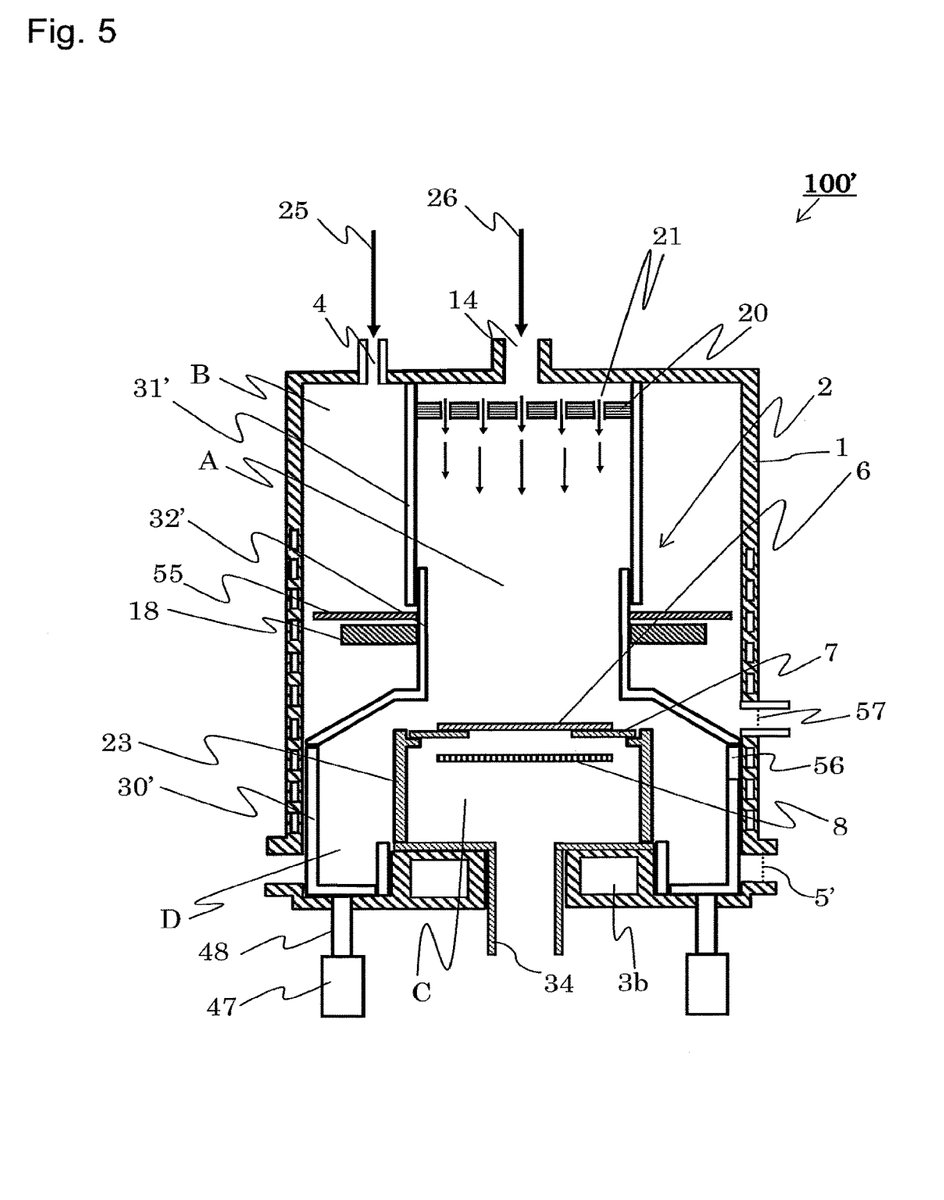
FIG. 5 is a schematic diagram of another example of the film-forming apparatus according to this embodiment displaying the first liner 31', the second liner 30', and the third liner 32'.

As shown in FIG. 5, a film-forming apparatus 100' according to this embodiment is configured so as to include a first liner 31', a second liner 30', and a third liner 32'. These liners constitute the hollow cylindrical liner 2.

The original reason for providing the liner 2 is that the wall of the chamber 1 of the film-forming apparatus 100 is made of stainless steel. That is, the liner 2 prevents the wall made of stainless steel from being exposed to gas-phase reaction. Further, by providing the liner 2, it is also possible to obtain the effect of preventing deposition of particles on the wall of the chamber 1, contamination of the wall of the chamber 1 with metals, or erosion of the wall of the chamber 1 by the reaction gas 26 during formation of a crystalline film.

As described above, the hollow cylindrical liner 2 of the film-forming apparatus 100' includes the first liner 31', the second liner 30', and the third liner 32', and is formed by assembling these liners. The first liner 31', the second liner 30', and the third liner 32' may be made of, as one example, quartz. However, in the case of SiC epitaxial film formation that needs to be performed at a temperature as high as 1500° C. or higher, these liners are preferably formed from members obtained by coating carbon with SiC.

The first liner 31' has a hollow cylindrical form, and the upper end of the first liner 31' is fixed to the chamber 1. Further, the shower plate 20 fitted to the first liner 31' also functions as a gas straightening vane. The shower plate 20 has the through holes 21 for supplying the reaction gas 26 so that the reaction gas 26 can be uniformly supplied onto the surface of the semiconductor substrate 6.

The inner diameter of the first liner 31' is determined to correspond to the size of the semiconductor substrate 6 in consideration of the arrangement of the through holes 21 of the shower plate 20. The first liner 31' constitutes the channel of the reaction gas 26 to be supplied onto the semiconductor substrate 6 together with the third liner 32' that will be described later. This makes it possible to reduce wasted space and allow the reaction gas 26 to efficiently flow downward toward the semiconductor substrate 6.

The second liner 30' also has a hollow cylindrical form, and prevents the side wall and the bottom surface of the chamber 1 located below the semiconductor substrate 6 from being exposed to gas-phase reaction. The rotating cylinder 23, and the susceptor 7 attached thereto are located inside the second liner 30'.

Figure 6:
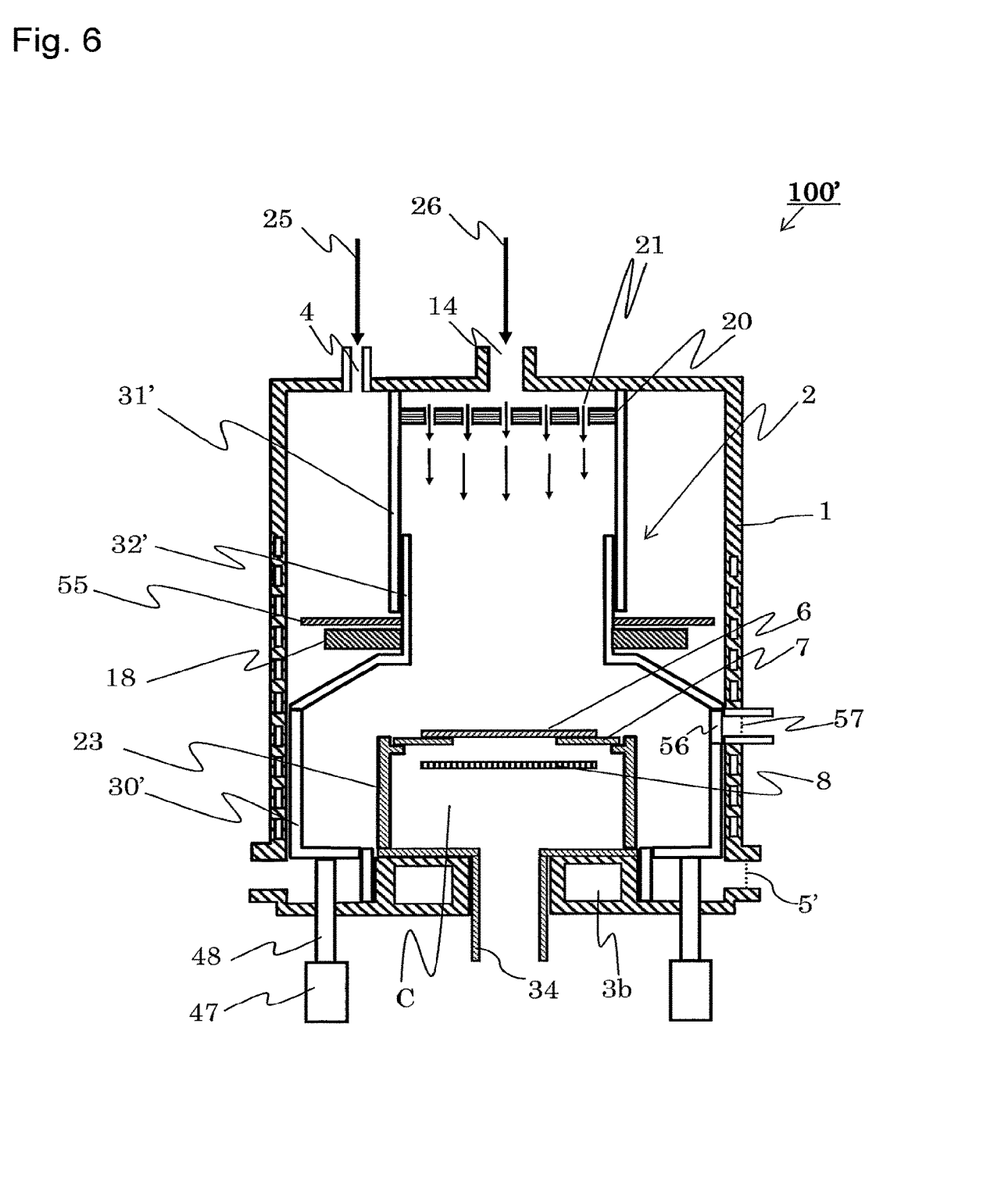
FIG. 6 is a schematic sectional view for explaining the state of the second liner 30' and the third liner 32' that have been raised up.
Figure 7:
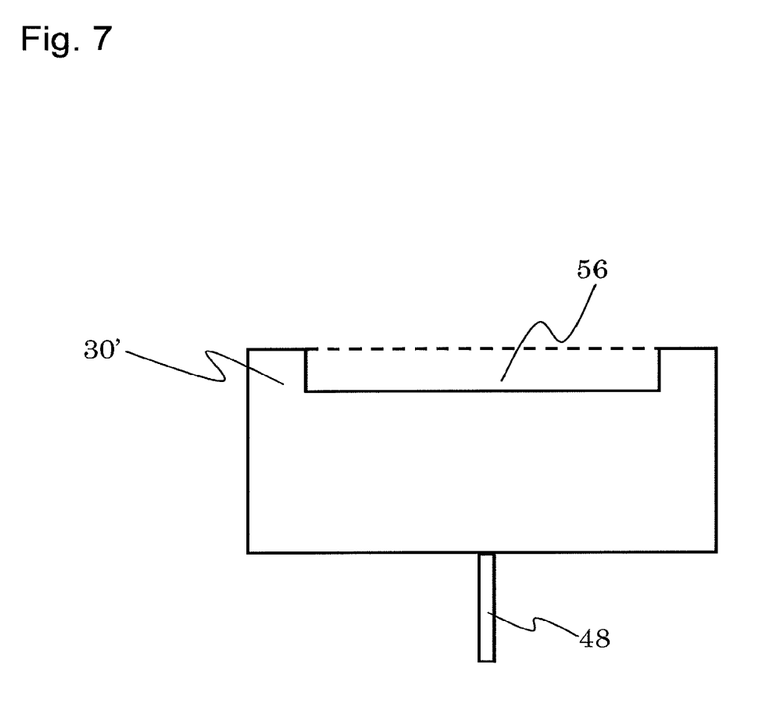
FIG. 7 is a schematic side view of the second liner 30' displaying the cutout portion provided at the upper end of part of its side wall constituting a transport port.

FIG. 7 is a schematic side view of the second liner 30'. The second liner 30' has a cutout portion provided at the upper end of part of its side wall. The cutout portion constitutes a first transport port 56 for the semiconductor substrate 6. That is, the semiconductor substrate 6 is transported into and out of the chamber 1 through the first transport port 56. As will be described later in detail with reference to FIG. 6, the semiconductor substrate 6 is transported into and out of the chamber 1 through the first transport port 56 after the third liner 32' supported by the second liner 30' is raised up from a level at which film formation is performed to a predetermined level thus allowing the semiconductor substrate to transported in and out.

The third liner 32' has a hollow cylindrical form, and is located between the first liner 31' and the second liner 30'. The third liner 32' is supported by the second liner 30', and is configured so as to surround an area above the periphery of the semiconductor substrate 6 placed on the susceptor 7 and an area around the semiconductor substrate 6. The upper heater 18 is provided along the surface of the third liner 32' opposed to the inner wall of the chamber 1, and is supported by a support unit (not shown) in the space B between the liner 2 and the inner wall of the chamber 1.

The film-forming apparatus 100' has a mechanism for lifting up the second liner 30' and the third liner 32' to transport the semiconductor substrate 6 into and out of the chamber 1 through the first transport port 56. FIG. 6 is a schematic sectional view for explaining the state of the second liner 30' and the third liner 32' that have been raised up. It is to be noted that the reaction gas 25 other than that used for a gas-phase growth reaction is discharged through a gas discharge portion 5' in the lower part of the chamber 1.

A lifting bar 48 is positioned at the bottom of the chamber 1 of the film-forming apparatus 100', the upper end of the lifting bar 48 is connected to the second liner 30'. Further, a lifting system 47 is provided under the film-forming chamber 100', and the lower end of the lifting bar 48 is connected to the lifting system 47. The lifting system 47 controls upward and downward movement of the lifting bar 48.

When the lifting bar 48 is moved upward under control of the lifting system 47, the second liner 30' and the third liner 32' are raised up by the lifting bar 48 that supports the second liner 30' from the lower side thereof. That is, the second liner 30' and the third liner 32' are moved up by the lifting bar 48. As a result, as shown in FIG. 6, the cutout portion of the second liner 30' is moved up to a predetermined level and then functions as the first transport port 56. It is to be noted that at this time, the upper portion of the third liner 32' and the lower portion of the first liner 31' surrounding it are spaced apart from each other, and are not in contact with each other. Therefore, the first liner 31' does not interfere with upward movement of the third liner 32'.

In this way, the second liner 30' and the third liner 32' can be raised up via the lifting bar 48 under control of the lifting system 47. As shown in FIGS. 5 and 6, the first transport port 56 is provided in the side wall of the second liner 30'. Therefore, the semiconductor substrate 6 can be transported into the chamber 1 and placed on the susceptor 7 and can be transported out of the chamber 1 through a second transport port 57 located in the side wall of the chamber 1 without interference from the second liner 30' and the third liner 32'.

After the semiconductor substrate 6 is transported into and out of the chamber 1, the lifting bar 48 is moved downward under control of the lifting system 47 to return the second liner 30' and the third liner 32' to their initial positions.

It is to be noted that according to this embodiment, the second liner 30' and the third liner 32' may be integrated with each other. For example, the first liner 31' may be used as an upper liner and a liner obtained by integrating the second liner 30' and the third liner 32' with each other may be used as a lower liner. In this case, the upper liner is located near the reaction gas supply portion 14 and functions as a channel through which the reaction gas flows downward from the reaction gas supply portion 14 toward the susceptor 7. The rotating cylinder that supports the susceptor 7 is positioned inside the lower liner. An opening corresponding to the first transport port 56 is also positioned inside the lower liner. The lifting system that controls lifting and lowering of the lower liner is positioned outside of the chamber. The lower liner is moved up to a level higher than a level at which film formation is performed, under control of the lifting system, to transport a substrate through the opening located in the lower liner. As described above, when the second liner 30' and the third liner 32' are separate members, there is an advantage that maintenance of the film-forming apparatus 100' is easily performed.

According to this embodiment, as shown in FIGS. 5 and 6, a reflector 55 may be provided above the upper heater 18. The reflector 55 reflects heat emitted from the upper heater 18 to improve the efficiency of heating the semiconductor substrate 6 placed on the susceptor 7, and also suppresses an excessive increase in the temperature of the semiconductor substrate 6 and the temperature of an area around the upper heater 18. The reflector 55 is not limited to one constituted from one thin plate, and may be one constituted from two or more thin plates spaced at appropriate intervals. A reflector may also be provided in the apparatus of FIG. 1, FIG. 3, and FIG. 4.

Such a film-forming apparatus makes it possible to prevent the upper heater 18 and the lower heater 8 from being degraded by the action of hydrogen gas contained in the reaction gas 26. That is, it is possible to prolong the lifetime of the upper heater 18 and the lower heater 8.

The features and advantages of the present invention may be summarized as follows:

According to the present invention, a Film-forming apparatus and method discloses, heaters that heat a wafer are kept under an inert gas atmosphere, which makes it possible to provide a film-forming apparatus that can prolong the lifetime of the heaters and can be used under high temperature conditions.

Obviously many modifications and variations of the present invention are possible in the light of the above teachings. It is therefore to be understood that within the scope of the appended claims the invention may be practiced otherwise than as specifically described.

What is claimed is:

1. A film-forming apparatus comprising:
a film-forming chamber;
a hollow liner provided in the film-forming chamber;
a susceptor provided in the film-forming chamber to place a substrate thereon;
an upper heater located between the liner and the inner wall of the film-forming chamber and located above the susceptor in order to heat the substrate from above;
a lower heater located below the susceptor in order to heat the substrate from below;
a reaction gas supply portion for supplying a reaction gas for forming a SiC film on the substrate;

a first inert gas supply portion that supplies a first inert gas into a space around the hollow liner;

a second inert gas supply portion that supplies a second inert gas into a space around the lower heater;

an inert gas discharge portion for discharging the second inert gas from a space around the lower heater; and a gas discharge portion located at a position lower than a position of the susceptor in the film-forming chamber, the gas discharge portion discharging the reaction gas, the first inert gas, and the second inert gas outside the film-forming chamber.

2. The film-forming apparatus according to claim 1, wherein the hollow liner is cylindrically-shaped.

3. The film-forming apparatus according to claim 1, wherein the reaction gas supply portion is located in the upper part of the film-forming chamber.

4. The film-forming apparatus according to claim 1, wherein the inert gas is argon gas.

\* \* \* \* \*